(12) United States Patent
Johnson

(10) Patent No.: US 10,205,451 B1
(45) Date of Patent: Feb. 12, 2019

(54) METHODS AND APPARATUSES FOR DYNAMIC STEP SIZE FOR IMPEDANCE CALIBRATION OF A SEMICONDUCTOR DEVICE

(71) Applicant: MICRON TECHNOLOGY, INC., Boise, ID (US)

(72) Inventor: Jason M. Johnson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/882,723

(22) Filed: Jan. 29, 2018

(51) Int. Cl.
*H03K 19/00* (2006.01)
*G11C 8/10* (2006.01)

(52) U.S. Cl.
CPC .......... *H03K 19/0005* (2013.01); *G11C 8/10* (2013.01)

(58) Field of Classification Search
None
See application file for complete search history.

(56) References Cited

U.S. PATENT DOCUMENTS

| | | | |
|---|---|---|---|
| 4,511,959 A | 4/1985 | Nicolas et al. | |
| 4,745,548 A | 5/1988 | Blahut | |
| 4,986,183 A | 1/1991 | Jacob et al. | |
| 6,661,860 B1 | 12/2003 | Gutnik et al. | |
| 6,836,144 B1 | 12/2004 | Bui et al. | |
| 7,039,824 B2 | 5/2006 | Simon et al. | |
| 7,215,128 B2 | 5/2007 | Fujisawa | |
| 7,269,043 B2 | 9/2007 | Lee | |
| 7,432,731 B2 | 10/2008 | Bains et al. | |
| 7,436,202 B2 | 10/2008 | Lin et al. | |
| 7,443,193 B1* | 10/2008 | Santurkar | H03H 11/28 326/30 |
| 7,973,553 B1 | 7/2011 | Wang et al. | |
| 7,990,174 B2 | 8/2011 | Park | |
| 9,318,183 B2 | 4/2016 | Ware et al. | |
| 9,666,245 B2 | 5/2017 | Arai et al. | |

(Continued)

FOREIGN PATENT DOCUMENTS

JP 2009237678 A 10/2009
KR 20070036578 A 4/2007

(Continued)

OTHER PUBLICATIONS

U.S. Appl. No. 15/630,901, titled "Timing Based Arbitration Methods and Apparatuses for Calibrating Impedances of a Semiconductor Device" filed Jun. 22, 2017.

(Continued)

*Primary Examiner* — Jany Richardson
(74) *Attorney, Agent, or Firm* — Dorsey & Whitney LLP

(57) ABSTRACT

Methods and apparatuses are provided for dynamic step size for impedance calibration of a semiconductor device. An example apparatus includes a resistor, and a chip including a driver impedance calibration circuit configured to determine an impedance of the driver based on an impedance of the resistor. During a calibration operation, the driver impedance calibration circuit is configured to adjust an impedance code that controls an impedance of the driver to provide a next impedance code based on a comparison of a driver output voltage with a reference voltage. An adjustment step size of the impedance code is determined based on a value of the impedance code.

16 Claims, 6 Drawing Sheets

(56) References Cited

U.S. PATENT DOCUMENTS

| | | |
|---|---|---|
| 9,711,189 B1 | 7/2017 | Wang et al. |
| 9,740,269 B1 | 8/2017 | Tatapudi et al. |
| 9,766,831 B2 | 9/2017 | Gans |
| 9,767,921 B1 | 9/2017 | Pan |
| 2003/0126356 A1 | 7/2003 | Gustavson et al. |
| 2003/0235084 A1 | 12/2003 | Zumkehr et al. |
| 2004/0128429 A1 | 7/2004 | Khandekar et al. |
| 2004/0174185 A1 | 9/2004 | Lin et al. |
| 2004/0240255 A1 | 12/2004 | Smith et al. |
| 2005/0040845 A1 | 2/2005 | Park |
| 2005/0226080 A1 | 10/2005 | Lee |
| 2006/0158198 A1 | 7/2006 | Fujisawa |
| 2008/0054935 A1 | 3/2008 | Pan |
| 2008/0198666 A1 | 8/2008 | Nygren |
| 2009/0009212 A1 | 1/2009 | Brox |
| 2009/0224802 A1 | 9/2009 | Hollis et al. |
| 2011/0128038 A1 | 6/2011 | Ko |
| 2011/0283060 A1 | 11/2011 | Ware et al. |
| 2013/0015880 A1 | 1/2013 | Haraguchi |
| 2013/0036253 A1 | 2/2013 | Baltar |
| 2013/0088257 A1 | 4/2013 | Hara |
| 2013/0311717 A1 | 11/2013 | Kim et al. |
| 2013/0335114 A1 | 12/2013 | Chen et al. |
| 2014/0097911 A1 | 4/2014 | Kaiwa et al. |
| 2014/0185384 A1 | 7/2014 | Kim et al. |
| 2014/0185401 A1 | 7/2014 | Yang et al. |
| 2015/0019831 A1 | 1/2015 | Van Huben et al. |
| 2015/0067292 A1 | 3/2015 | Grunzke |
| 2015/0270010 A1 | 9/2015 | Kang |
| 2015/0340069 A1 | 11/2015 | Arai et al. |
| 2015/0364177 A1 | 12/2015 | Lee |
| 2016/0042769 A1 | 2/2016 | Moran |
| 2017/0109091 A1 | 4/2017 | Gans |
| 2017/0109249 A1 | 4/2017 | Tatapudi et al. |
| 2017/0162238 A1 | 6/2017 | Lee et al. |
| 2017/0351451 A1 | 12/2017 | Gans |
| 2018/0167055 A1 | 6/2018 | Gans |

FOREIGN PATENT DOCUMENTS

| | | |
|---|---|---|
| KR | 10-2007-0088845 A | 8/2007 |
| KR | 10-2008-0002692 A | 1/2008 |
| KR | 10-2012-0087662 A | 8/2012 |
| TW | 201225079 A | 6/2012 |
| TW | 201532051 A | 8/2015 |
| TW | 201640358 A | 11/2015 |
| WO | 2010144624 A1 | 12/2010 |

OTHER PUBLICATIONS

U.S. Appl. No. 15/683,439, titled "Timing Based Arbiter Systems and Circuits for ZQ Calibration", filed Aug. 22, 2017.

U.S. Appl. No. 16/008,955, titled "Apparatuses and Methods for Identifying Memory Devices of a Semiconductor Device Sharing an External Resistance" filed Jun. 14, 2018.

Singh, et al., "MOUSETRAP: High-Speed Transition-Signaling Asynchronous Pipelines", IEEE Transactions on Very Large Scale Integration (VLSI) Systems, vol. 15, No. 6, Jun. 2007, 15 pages.

\* cited by examiner

METHODS AND APPARATUSES FOR DYNAMIC STEP SIZE FOR IMPEDANCE CALIBRATION OF A SEMICONDUCTOR DEVICE

BACKGROUND

High data reliability, high speed of memory access, and reduced chip size are features that are demanded from semiconductor memory. In recent years, there has been an effort to further increase the speed of memory access.

In conventional peripheral circuitries for a semiconductor memory device, for example, pads and data input/output circuits are arranged in a corresponding manner across layers. For example, a semiconductor memory device may include a data input/output circuit. To achieve high speed transmission, the impedance of the data input/output circuit should be controlled. To control the impedance, an external resistance, such as ZQ resistor may be coupled, and a driver impedance may be adjusted based on a comparison with an impedance of the ZQ resistor. However, in some instances, the impedance curve of a driver to be adjusted may be non-linear such that adjustments in one part of the curve may have a smaller impact on impedance of the driver than adjustments in other parts of the curve.

DETAILED DESCRIPTION OF VARIOUS EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
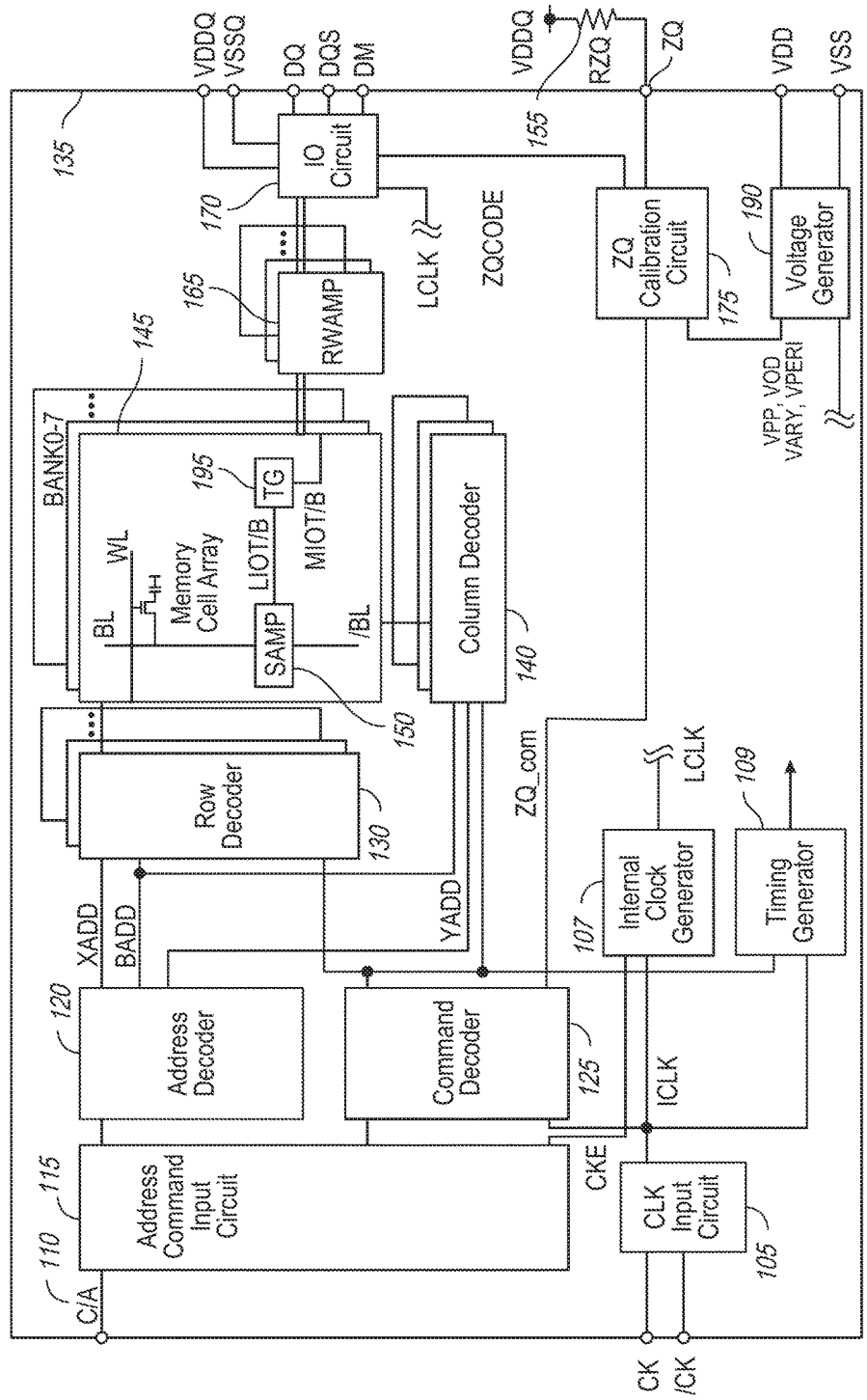
FIG. 1 is a schematic block diagram of a semiconductor memory device, in accordance with an embodiment of the present disclosure.

FIG. 1 is a schematic block diagram of a semiconductor memory device 100, in accordance with an embodiment of the present disclosure. For example, the semiconductor memory device 100 may include a chip 135 and a ZQ resistor (RZQ) 155. The chip 135 may include a clock input circuit 105, an internal clock generator 107, a timing generator 109, an address command input circuit 115, an address decoder 120, a command decoder 125, a plurality of row decoders 130, a memory cell array 145 including sense amplifiers 150 and transfer gates 195, a plurality of column decoders 140, a plurality of read/write amplifiers 165, an input/output (I/O) circuit 170, a ZQ calibration circuit 175, and a voltage generator 190. The semiconductor memory device 100 may include a plurality of external terminals including address and command terminals coupled to command/address bus 110, clock terminals CK and ICK, data terminals DQ, DQS, and DM, power supply terminals VDD, VSS, VDDQ, and VSSQ, and a calibration terminal ZQ. The chip 135 may be mounted on a substrate, for example, a memory module substrate, a mother board or the like.

The memory cell array 145 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide or generate various internal command signals. For example, the internal command signals may include a row command signal to select a word line, a column command signal, such as a read command or a write command, to select a bit line, and a ZQ calibration command that may activate the ZQ calibration circuit 175.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VS SQ. For example, the power supply voltages VDDQ and VSSQ may be the same voltages as the power supply voltages VDD and VSS, respectively. However, the dedicated power supply voltages VDDQ and VSSQ may be used for the IO circuit 170 and the ZQ calibration circuit 175.

Figure 5:
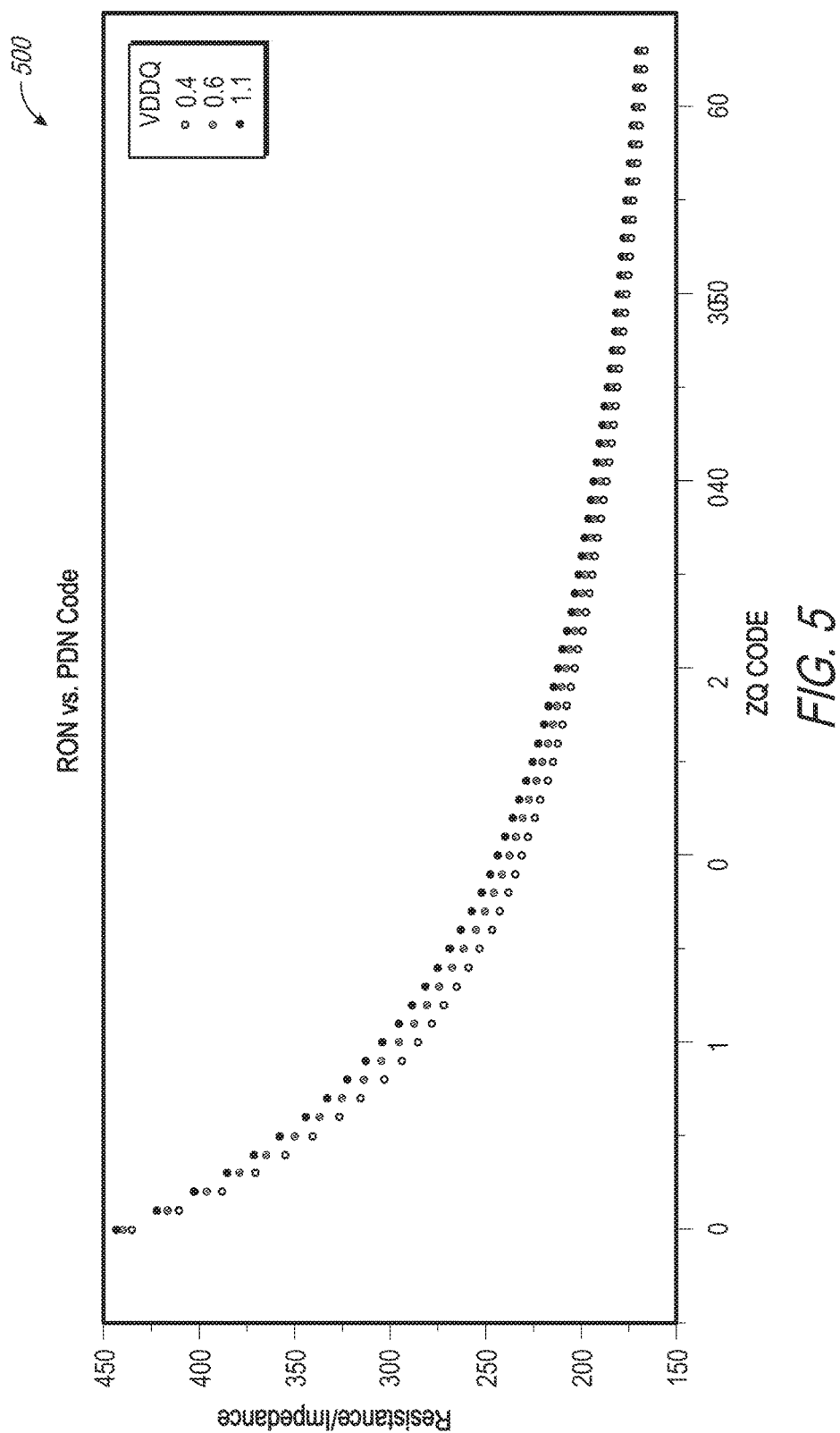
FIG. 5 depicts an exemplary impedance curve for a pull-down circuit of a driver over three different voltages as compared with an impedance code in accordance with an embodiment of the disclosure.

The calibration terminal ZQ of the semiconductor memory device 100 may be coupled to the ZQ calibration circuit 175. The ZQ calibration circuit 175 may perform a calibration operation with reference to an impedance of the ZQ resistor (RZQ) 155. In some examples, the ZQ resistor (RZQ) 155 may be mounted on a substrate that is coupled to the calibration terminal ZQ. For example, the ZQ resistor (RZQ) 155 may be coupled to a power supply voltage (VDDQ). An impedance code ZQCODE obtained by the calibration operation may be provided to the IO circuit 170, and thus an impedance of an output buffer (not shown) included in the IO circuit 170 is specified. In some examples, the ZQ calibration circuit 175 may include a dynamic adder/subtractor circuit that dynamically selects step sizes of adjustments to the ZQCODE during the calibration operation. The selection of the step size adjustments may be based on a current value of the ZQCODE. By using a dynamic adder/subtractor circuit, the calibration operation time may be reduced when calibrating a driver of the I/O circuit 170 that has a non-linear impedance curve. For example, FIG. 5 depicts an exemplary impedance curve 500 for a pull-down circuit of a driver over three different voltages as compared with a ZQCODE value in accordance with embodiments of the disclosure. As shown in FIG. 5, the impedance curve 500 flattens out as the ZQCODE gets larger. In the example of FIG. 5, an impedance (e.g., Resistance) value difference between the ZQCODE values 50 and 51 is less than an impedance value difference between the ZQCODE values 9 and 10. Therefore, a higher value ZQCODE would require a larger step to achieve the same impedance change in the driver as compared with a lower value ZQCODE. The dynamic adder/subtractor circuit may be configured to adjust increment and decrement step sizes based on a current value of the ZQCODE, in some examples.

Figure 2:
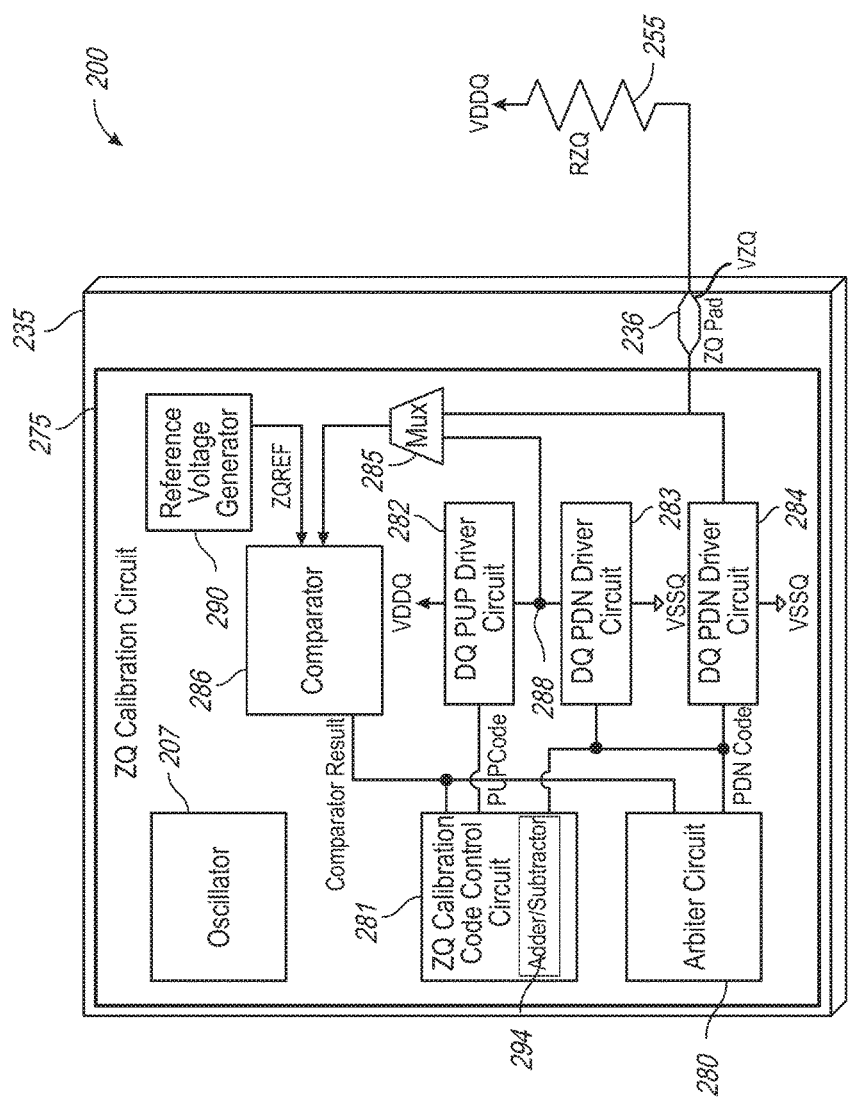
FIG. 2 is a circuit diagram of a ZQ calibration circuit in accordance with an embodiment of the present disclosure.

FIG. 2 is a circuit diagram of a ZQ calibration circuit 275 in accordance with an embodiment of the present disclosure. For example, the chip 235 includes the ZQ calibration circuit 275 and a calibration terminal ZQ (e.g., ZQ pad) 236. In some examples, the ZQ calibration circuit 275 may include an arbiter circuit 280 that controls initiation of a calibration operation when multiple chips are coupled to the ZQ resistor RZQ 255.

The arbiter circuit 280 may be activated responsive to an activation of a chip (e.g., power on, etc.), and may provide a pull-down (PDN) code signal when activated. The ZQ calibration circuit 275 may include a combination of a data terminal (DQ) pull-up (PUP) driver circuit 282 and a data terminal (DQ) pull-down (PDN) driver circuit 283 and a data terminal (DQ) pull-down (PDN) driver circuit 284 for arbitration as well as calibration. The DQ PUP driver circuit 282, DQ PDN driver circuit 283, and DQ PDN driver circuit 284 are replica circuits of a data terminal (DQ) pull-up (PUP) driver circuit, a data terminal (DQ) pull-down (PDN) driver circuit and a data terminal (DQ) pull-down (PDN) driver circuit attached to actual data terminals DQ. The DQ PDN driver circuit 284 may receive the PDN code signal from the arbiter circuit 280, and may pull down a ZQ pad voltage (VZQ) at the calibration terminal ZQ 236 responsive to the PDN code signal.

The ZQ pad voltage (VZQ) may be provided to a switch 285 (e.g., multiplexer Mux). The combination of the DQ PUP driver circuit 282 and the DQ PDN driver circuit 283 may execute adjustment of an intermediate ZQ voltage (iVZQ) at an intermediate node 288 between the combination of the DQ PUP driver circuit 282 and the DQ PDN driver circuit 283. For example, the DQ PUP driver circuit 282 may include a plurality of transistors coupled in parallel between a power supply terminal VDDQ and the intermediate node 288. The DQ PDN driver circuit 283 may include a plurality of transistors coupled in parallel between a power supply terminal VSSQ and the intermediate node 288. The intermediate ZQ voltage (iVZQ) may be provided to the switch 285. The switch 285 may provide either the ZQ pad voltage VZQ or the intermediate ZQ voltage iVZQ, depending on whether the ZQ calibration circuit 275 is executing arbitration or ZQ calibration, respectively. For example, the ZQ calibration circuit 275 may include a comparator 286.

The comparator 286 may compare the ZQ pad voltage VZQ or the intermediate ZQ voltage iVZQ provided by the switch 285 with a ZQ reference voltage ZQVREF or a ZQ arbitration reference voltage provided by a reference voltage generator 290. For example, the reference voltage generator 290 may be included in the ZQ calibration circuit 275, or the voltage generator 290 in FIG. 2 may provide the ZQ reference voltage ZQVREF and the ZQ arbitration reference voltage instead. For example, the comparator 286 may determine whether the ZQ pad voltage (VZQ) has been controlled by another requesting chip or the ZQ resistor RZQ 255 is currently in use.

The comparator 286 may provide a comparator result signal to the arbiter circuit 280 and a ZQ calibration code control circuit 281. For example, the arbiter circuit 280 may provide ZQ pad voltage control via the DQ PDN driver circuit 284 according to a ZQ timing pattern unique to the chip, having a fixed duration common to the plurality of chips. The arbiter circuit 280 may provide the PDN code until the ZQ pad voltage (VZQ) at the calibration terminal ZQ 236 matches the ZQ reference voltage ZQVREF. The ZQ timing pattern is unique for each chip, in order to determine whether the requesting chip should gain access to a ZQ resistor RZQ 255. The ZQ timing pattern may be programmed, or otherwise stored for each chip. For example, the arbiter circuit 280 for the chip 235 may include a register (not shown) for the chip 235 that may be programmed with the ZQ timing pattern information specific to the chip 235 for an assigned duration.

The ZQ calibration code control circuit 281 provides a PUP code and a PDN code to the DQ PUP driver circuit 282 and the DQ PDN driver circuit 283 respectively, responsive to the comparator result signal. In some examples, the PUP code and a PDN code are provided until the intermediate ZQ voltage iVZQ at the intermediate node 288 match the ZQ reference voltage ZQVREF. The PUP code and the PDN code may be included in the ZQCODE of FIG. 1. The ZQ calibration code control circuit 281 includes an adder/subtractor circuit 294 configured to adjust (e.g., increment or decrement) the PUP code and the PDN code based on the comparator result signal. The PUP code and the PDN codes set an impedance of the DQ PUP driver circuit 282 and the DQ PDN driver circuit 283, respectively, and adjusting the PUP code and the PDN codes adjust an impedance of the DQ PUP driver circuit 282 and the DQ PDN driver circuit 283, respectively.

In some examples, the impedance is adjusted by enabling or disabling transistors. For example, a first PUP code may enable a first set of transistors of the DQ PUP driver circuit 282, and increasing the PUP code by one may enable an additional transistor of the DQ PUP driver circuit 282, in addition to the first set of transistors. Conversely, decreasing the PUP code by one may disable one of the first set of transistors. Each time the PUP code or PDN code is adjusted, an impedance of the DQ PUP driver circuit 282 or the DQ PDN driver circuit 283, respectively, may be adjusted. A determination as to whether the PUP code or the PDN code are increased or decreased can be based on the comparison from the comparator 286. If the comparator 286 indicates that the voltage of the VZQ is higher than the ZQREF voltage, then the PUP or PDN code is adjusted in a first direction, and if the comparator 286 indicates that the voltage of the VZQ is lower than the ZQREF voltage, then the PUP or PDN code is adjusted in a second direction opposite the first direction.

In some examples, because of a design of the DQ PUP driver circuit 282 and the DQ PDN driver circuit 283, a change in impedance of the DQ PUP driver circuit 282 or the DQ PDN driver circuit 283 between consecutive PUP or PDN code values, respectively, may vary based on a current PUP or PDN code value. Generally, the higher the PUP or PDN code value, the less effect a same adjustment has on an impedance of the DQ PUP driver circuit 282 or the DQ PDN driver circuit 283, respectively as compared with a lower current code value. For example, when the PUP code has a low value, an increase of 1 affects the resulting impedance of the DQ PUP driver circuit 282 by more than an increase of 1 for a higher PUP code value.

In some examples, to mitigate this non-linear impedance as PUP and PDN code values increase, the adder/subtractor circuit 294 may dynamically change adjustment step size values for the PUP and PDN codes based on a current PUP or PDN code value. For example, a higher PUP or PDN code value may have a larger step size than a lower PUP or PDN code value. In some examples, the adder/subtractor circuit 294 may have a minimum adjustment step size of one, and may use a subset (e.g., two or more) of the most significant bits (MSBs) of the PDN or PUP code value to as the adjustment step size. For example, if the adder/subtractor circuit 294 provides a 6 bit PDN or PUP code value, the adjustment step size may be based on a value of the three MSBs of the current PDN or PUP code value. By dynamically adjusting the adjustment step sizes of the PDN or PUP code values by the adder/subtractor circuit 294 during a calibration operation, the time to complete the calibration may be reduced when PUP and PDN code values are higher (e.g., because of the reduced effect on changes in impedance of the DQ PUP driver circuit 282 and the DQ PDN driver circuit 283), and the adjustments may result in a more uniform change in impedance value.

The discussion for FIG. 2 describes performing calibration with adjusted step sizes for the PUP and PDN codes when the RZQ is coupled between VDDQ and the ZQ Pad 236, and includes calibrating the DQ PDN driver circuit 284 first, and then using that calibrated PDN code to set the DQ PDN Driver Circuit 283 for calibration of the DQ PUP driver circuit 282. It will be appreciated that calibration with adjusted step sizes for the PUP and PDN codes when the RZQ is coupled between VSSQ and the ZQ Pad 236 may be performed in a similar manner without departing from the scope of the disclosure, including calibration of the DQ PUP driver circuit 282 first, which would be coupled to the ZQ Pad, and then using that resulting PUP code to set an impedance of a second DQ PUP driver circuit in order to calibrate the DQ PDN driver circuit 283.

Figure 3:
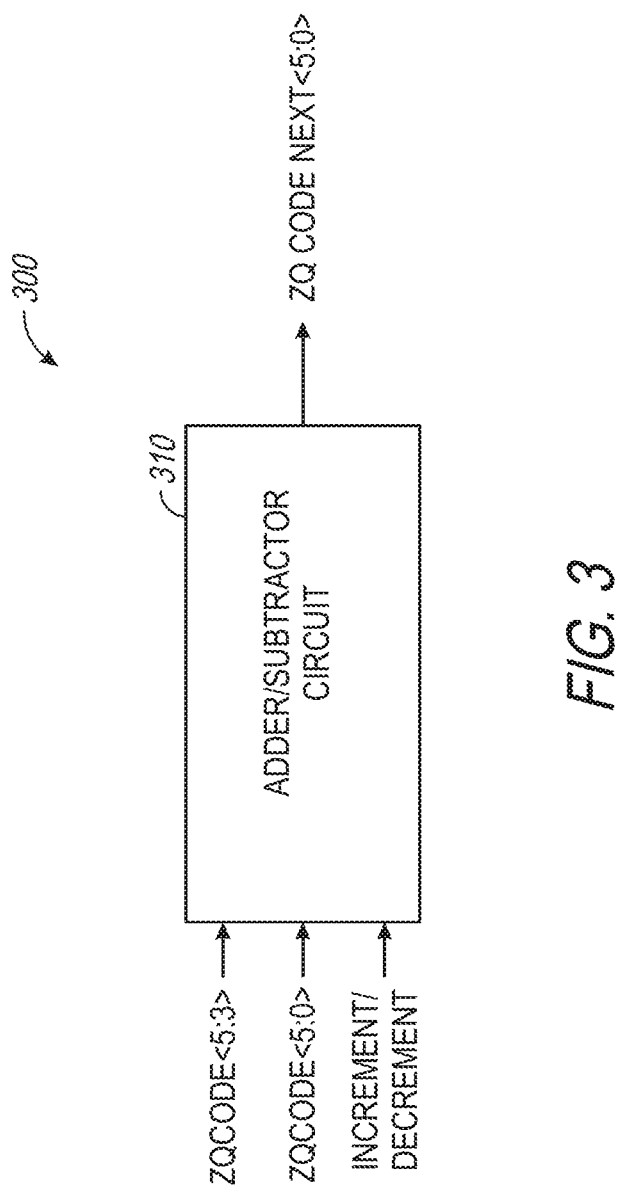
FIG. 3 is a circuit diagram of a ZQ calibration code control circuit including an adder/subtractor circuit in accordance with an embodiment of the present disclosure.

FIG. 3 is a circuit diagram of a ZQ calibration code control circuit 300 including an adder/subtractor circuit 310 in accordance with an embodiment of the present disclosure. The ZQ calibration code control circuit 281 of FIG. 2 may implement the ZQ calibration code control circuit 300. The adder/subtractor circuit 294 of FIG. 2 may implement the adder/subtractor circuit 310. The adder/subtractor circuit 310 may receive a current ZQCODE value ZQCODE<5:0>, a ZQCODE current step size value ZQCODE<5:3>, and an increment or decrement signal INCREMENT/DECREMENT and may provide a next ZQCODE value ZQCODENEXT<5:0> based on the ZQCODE<5:0>, the ZQCODE<5:3>, and the INCREMENT/DECREMENT signals.

The INCREMENT/DECREMENT signal indicates whether the adjustment to the ZQCODE<5:0> signal is an increment or a decrement. The INCREMENT/DECREMENT signal value is based on a comparator result signal from a comparator, such as the comparator 286 of FIG. 2. When the INCREMENT/DECREMENT signal indicates an increment to the ZQCODE value, the ZQCODE<5:0> is increased by the value of the ZQCODE<5:3> or 1, whichever is greater, to provide the ZQCODENEXT<5:0>. That is, the ZQCODE<5:0> value is incremented by at least 1, and more if the ZQCODE <5:3> is greater than 1. When the INCREMENT/DECREMENT signal indicates a decrement to the ZQCODE value, the ZQCODE<5:0> is decreased by the value of the ZQCODE<5:3> or 1, whichever is greater, to provide the ZQCODENEXT<5:0>. That is, the ZQCODE<5:0> value is decremented by at least 1, and more if the ZQCODE<5:3> is greater than 1. Further, the ZQCODE NEXT<5:0> value has an overall maximum of 63 (e.g., binary value of all 1's) and an overall minimum value of zero.

Figure 4:
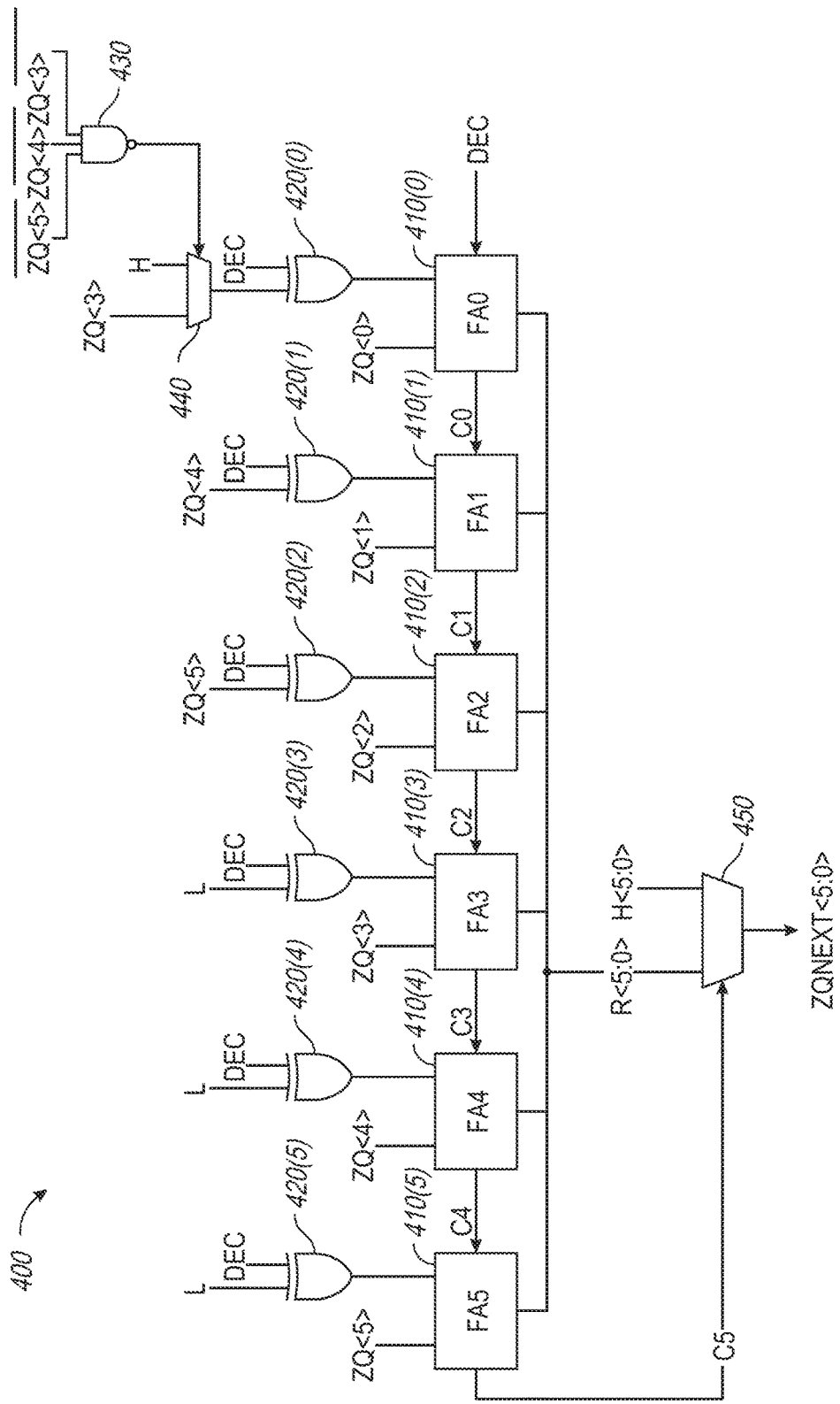
FIG. 4 is a circuit diagram of an adder/subtractor circuit in accordance with an embodiment of the present disclosure.

FIG. 4 is a circuit diagram of an adder/subtractor circuit 400 in accordance with an embodiment of the present disclosure. The adder/subtractor circuit 294 of FIG. 2 or the adder/subtractor circuit 310 of FIG. 3 may implement the adder/subtractor circuit 400. The adder/subtractor circuit 400 may include full adder circuits FA5-0 410(5)-(0) coupled to XOR logic gates 420(5)-(0), respectively. The adder/subtractor circuit 400 may further include a NAND gate 430 coupled to a multiplexer 440 and a multiplexer 450 to provide an output. The ZQ<5:0> signals may indicate the current ZQCODE value. The increment/decrement signal DEC may indicate whether the adder/subtractor circuit 400 is to perform a bitwise addition operation (e.g., increment) or a bitwise subtraction operation (e.g., decrement). The circuitry of the adder/subtractor circuit 400 may use a twos-complement method to perform a subtraction operation based on the DEC signal and the XOR gates 420(5)-(0). For example, the DEC signal set to a logical low value indicates an addition operation, and the DEC signal set to a logical high value indicates a subtraction operation. The carry signal C5-C0 may indicate carry value outputs provided from a respective one of the FA5-0 circuits 410(5)-(0) to an adjacent one of the FA5-0 circuits 410(5)-(0). The resultant value R<5:0> may indicate an output of the FA5-0 circuits 410(5)-(0). The high signals H<5:0> signal is an all high output. The output ZQCODE signal ZQNEXT<5:0> is the result of the adjustment of the ZQ<5:0> signal.

In operation, the NAND gate 430 and the multiplexer 440 may be used to set a minimum step value of 1. For example, if the values of the ZQ<5:3> bits are all set to zero, the output of the NAND gate 430 may cause the multiplexer 440 may to output a high signal H (e.g., a logical 1 value). Otherwise, the multiplexer 440 may output a value of the ZQ<3> signal.

When the DEC value indicates an addition operation, the XOR gates 420(5)-(0) provide the value of the respective other input signal at a respective output. For example, when the DEC value indicates an addition operation, the XOR gates 420(5)-(0) provide the low logical value signal L, the L signal, the ZQ<5> signal, the ZQ<4> signal, and a signal provided from the output of the multiplexer 440, respectively, at a respective output. That is, the ZQ<5:0> values received at the FA5-0 circuits 410(5)-(0) represent one of the addends of the addition operation, and the L signals and ZQ5:3> input to the respective XOR gates 420(5)-(0) represent the other addend of the addition operation.

When the DEC value indicates a subtraction operation, the XOR gates 420(5)-(0) provide an inverted value of the respective other input signal at a respective output. For example, when the DEC value indicates a subtraction operation, the XOR gates 420(5)-(0) provide an inverted L signal (e.g., an H signal), an inverted L signal, an inverted ZQ<5> signal, an inverted ZQ<4> signal, and an inverted output signal provided from the multiplexer 440, respectively at a respective output. That is, the ZQ<5:0> values received at the FA5-0 circuits 410(5)-(0) represent the minuend of the subtraction operation, and the outputs of the L signals and the ZQ5:3> signals input into the respective the XOR gates 420(5)-(0) represent the subtrahend of the subtraction operation.

The DEC signal received at the FA0 circuit 410(0) may act as a carry in signal. Each of the FA5-0 circuits 410(5)-(0) may perform an add or a subtraction operation responsive to receipt of the respective ZQ<5:> signals, the respective outputs of the XOR gates 420(5)-(0), and the respective carry signals C4-C0 and DEC (for the FA0 circuit 410(0)). In response to the addition or subtraction operation, each of the FA5-0 circuits 410(5)-(0) may provide a respective resultant bit R<5:0> to the multiplexer 450. The multiplexer 450 may provide one of the R<5:0> or the H<5:0> as the ZQNEXT<5:0> value in response to the carry out signal C5. The C5 signal may indicate whether the adder/subtractor circuit 400 has exceeded a maximum value of 63, and the multiplexer 450 caps the ZQNEXT<5:0> at 63 (e.g., all logical high or 1 values).

Logic levels of signals used in the embodiments described above are merely examples. However, in other embodiments, combinations of the logic levels of signals other than those specifically described in the present disclosure may be used without departing from the scope of the present disclosure.

Figure 6:
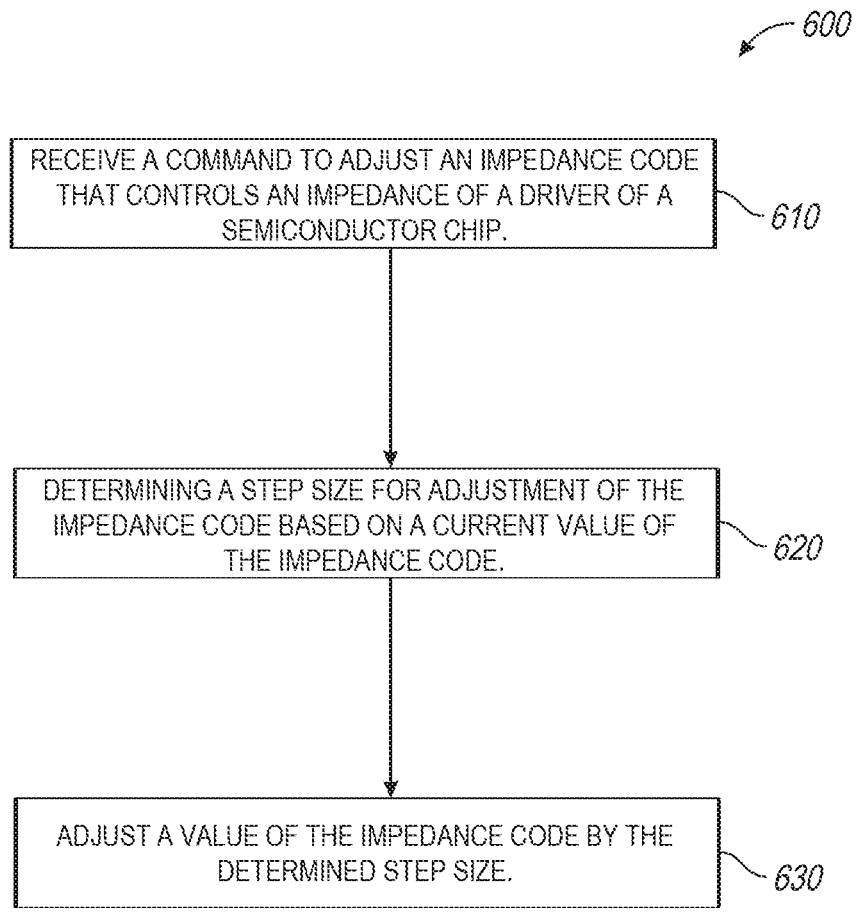
FIG. 6 is a flow diagram of an exemplary method for adjusting an impedance code in a ZQ calibration circuit in accordance with an embodiment of the present disclosure.

FIG. 6 is a flow diagram of an exemplary method 600 for adjusting an impedance code in a ZQ calibration circuit in accordance with an embodiment of the present disclosure. The method 600 may be performed, at least in part, using the ZQ calibration circuit 175 of FIG. 1, the ZQ calibration circuit 275 of FIG. 2, the ZQ calibration code control circuit 300 of FIG. 3, the adder/subtractor circuit 400 of FIG. 4, or combinations thereof.

The method 600 may include receiving a command to adjust an impedance code that controls an impedance of a driver of a semiconductor chip, at 610. In some examples, the semiconductor chip may include the semiconductor memory device 100 of FIG. 1. The driver may include a driver in the I/O circuit 170 of FIG. 1, the DQ PUP driver circuit 282, the DQ PDN driver circuit 283, and/or the DQ PDN driver circuit 284 of FIG. 2, or combinations thereof. The impedance code may include the ZQCODE of FIG. 1, the PUP and/or PDN codes of FIG. 1, the ZQCODENEXT<5:0> of FIG. 3, the ZQNEXT<5:0> of FIG. 4, or combinations thereof. In some examples, the method 600 may further include comparing an output voltage of the driver with a reference voltage to determine whether to adjust the impedance code. The comparison may be performed by the comparator 286 of FIG. 2, in some examples.

The method 600 may further include determining a step size for adjustment of the impedance code based on a current value (e.g., ZQCODE<5:0> of FIG. 3 or ZQ<5:0> of FIG. 4) of the impedance code, at 620. Determining a step size for adjustment of the impedance code may include setting the step size to a value of a subset of most significant bits (MSBs) of the current value of the impedance code. In some examples, the subset of the MBSs may include the three MSBs (e.g., ZQCODE<5:3> of FIG. 3 and/or ZQ<5:3> of FIG. 4) of the current value of the impedance code. Determining a step size for adjustment of the impedance code may further include setting the step size to a minimum value (e.g., 1) when the current value of the impedance code less than a particular value (e.g., when the subset of MSBs are all 0).

The method 600 may further include adjusting a value of the impedance code by the determined step size, at 630. Adjusting the value of the impedance code by the determined step size may include performing one of an addition or subtraction operation. The addition or subtraction may be performed by the adder/subtractor 294 of FIG. 2, the adder/subtractor 310 of FIG. 3, the adder/subtractor 400 of FIG. 4, or combinations thereof. In some examples, the method 600 may further include stopping adjustment of the impedance code when an impedance of the driver results in a desired output voltage.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
   a resistor; and
   a chip comprising a driver impedance calibration circuit configured to determine an impedance of a driver based on an impedance of the resistor, wherein, during a calibration operation, the driver impedance calibration circuit is configured to adjust an impedance code that controls an impedance of the driver and to provide a next impedance code based on a comparison of a driver output voltage with a reference voltage, wherein an adjustment step size of the impedance code is determined based on a value of the impedance code, wherein the driver impedance calibration circuit comprises an adder/subtractor circuit configured to adjust the impedance code based on a comparison of a driver output voltage with a reference voltage and wherein the adder/subtractor circuit is configured to adjust the impedance code by a value equal to a value of a subset of most significant bits of the impedance code.

2. The apparatus of claim 1, wherein the adder/subtractor circuit is configured to adjust the impedance code by a value equal to a value of three most significant bits of the impedance code.

3. The apparatus of claim 1, wherein the adder/subtractor circuit is configured to adjust the impedance code by at least a value of 1.

4. An apparatus comprising:
   a resistor; and
   a chip comprising a driver impedance calibration circuit configured to determine an impedance of a driver based on an impedance of the resistor, wherein, during a calibration operation, the driver impedance calibration circuit is configured to adjust an impedance code that controls an impedance of the driver and to provide a next impedance code based on a comparison of a driver output voltage with a reference voltage, wherein an adjustment step size of the impedance code is determined based on a value of the impedance code, wherein the driver impedance calibration circuit comprises an adder/subtractor circuit configured to adjust the impedance code based on a comparison of a driver output voltage with a reference voltage and wherein the adder/subtractor circuit comprises a plurality of full adder circuits configured to perform a bitwise addition or subtraction operation based on the value of the impedance code to provide the next impedance code.

5. The apparatus of claim 4, wherein the adder/subtractor circuit is further configured to limit a value of the impedance code a maximum value based on a count of bits included in the next impedance code.

6. A driver impedance calibration circuit of a semiconductor chip comprising:
   an adder/subtractor circuit configured to, during an impedance calibration operation, adjust an impedance code to a next impedance code by a step size determined based on a value of the impedance code, wherein the adder/subtractor circuit is configured to adjust the impedance code by a value equal to a value of a subset of most significant bits of the impedance code.

7. The driver impedance calibration circuit of the semiconductor chip of claim 6, wherein the adder/subtractor circuit is configured to set a minimum step size to 1.

8. A driver impedance calibration circuit of a semiconductor chip comprising:
   an adder/subtractor circuit configured to, during an impedance calibration operation, adjust an impedance code to a next impedance code by a step size determined based on a value of the impedance code, wherein the adder/subtractor circuit is configured to adjust the impedance code by a value equal to a value of at least three most significant bits of the impedance code.

9. A driver impedance calibration circuit of a semiconductor chip comprising:
   an adder/subtractor circuit configured to, during an impedance calibration operation, adjust an impedance code to a next impedance code by a step size determined based on a value of the impedance code, wherein the adder/subtractor circuit included a NAND logic gate to perform a bitwise NAND operation on a subset of inverted most significant bit values of the impedance code and a multiplexer configured to set the step size to the minimum step size based on an output of the NAND gate.

10. A driver impedance calibration circuit of a semiconductor chip comprising:
    an adder/subtractor circuit configured to, during an impedance calibration operation, adjust an impedance code to a next impedance code by a step size determined based on a value of the impedance code, wherein the adder/subtractor circuit comprises a plurality of full adder circuits configured to perform a bitwise addition or subtraction operation based on the value of the impedance code to provide the next impedance code.

11. A method comprising:
    receiving a command to adjust an impedance code that controls an impedance of a driver of a semiconductor chip;
    determining a step size for adjustment of the impedance code based on a current value of the impedance code, wherein determining the step size for adjustment of the impedance code comprises setting the step size to a value of a subset of most significant bits of the current value of the impedance code; and
    adjusting a value of the impedance code by the determined step size.

12. The method of claim 11, wherein determining the step size for adjustment of the impedance code comprises setting the step size to a value of a three most significant bits of the current value of the impedance code.

13. The method of claim 11, wherein determining the step size for adjustment of the impedance code comprises setting the step size to a minimum value when the current value of the impedance code less than a particular value.

14. The method of claim 11, further comprising stopping adjustment of the impedance code when an impedance of the driver results in a desired output voltage.

15. The method of claim 11, wherein adjusting the value of the impedance code by the determined step size comprises performing one of an addition or subtraction operation.

16. The method of claim 11, further comprising comparing an output voltage of the driver with a reference voltage to determine whether to adjust the impedance code.

* * * * *